United States Patent [19]
Imanishi et al.

[11] Patent Number: 5,952,728
[45] Date of Patent: Sep. 14, 1999

[54] THERMOELECTRIC CONVERSION MODULE HAVING CHANNELS FILLED WITH SEMICONDUCTING MATERIAL AND INSULATING FILLERS

[75] Inventors: Yuichiro Imanishi; Makoto Miyoshi; Tetsuo Watanabe, all of Nagoya; Keiko Kushibiki, Fujisawa; Kazuhiko Shinohara, Yokohama; Masakazu Kobayashi, Yokosuka; Kenji Furuya, Yokohama, all of Japan

[73] Assignees: NGK Insulators, Ltd.; Nissan Motor Co., Ltd., both of Japan

[21] Appl. No.: 08/744,600

[22] Filed: Nov. 7, 1996

[30] Foreign Application Priority Data

Nov. 13, 1995 [JP] Japan ..................... 7-294349
Oct. 24, 1996 [JP] Japan ..................... 8-282480

[51] Int. Cl.$^6$ .................................... H01L 23/56
[52] U.S. Cl. ................... 257/930; 257/120; 257/374; 257/275; 257/712; 257/713; 257/717; 257/467; 257/470; 62/3.2; 62/3.3; 136/224; 136/225
[58] Field of Search ................... 136/203–205, 136/212, 211, 224, 225; 257/712, 713, 930, 120, 374, 275, 717, 467, 470; 73/23.02, 25.03, 23.39; 62/3.2, 3.3

[56] References Cited

U.S. PATENT DOCUMENTS

| | | | |
|---|---|---|---|
| 2,749,716 | 6/1956 | Lindenblad | 62/1 |
| 2,980,746 | 4/1961 | Claydon . | |
| 3,509,620 | 5/1970 | Phillips | 29/573 |
| 3,615,870 | 10/1971 | Crouthamel | 136/204 |
| 3,726,100 | 4/1973 | Widakawich | 136/203 |
| 4,149,025 | 4/1979 | Niculescu | 136/206 |
| 4,275,259 | 6/1981 | Yamamoto et al. | 136/204 |
| 4,493,939 | 1/1985 | Blaske et al. | 136/212 |
| 5,156,004 | 10/1992 | Wu et al. | 257/930 |
| 5,430,322 | 7/1995 | Koyanagi et al. | 257/930 |

FOREIGN PATENT DOCUMENTS

| | | |
|---|---|---|
| 0 176 671 A1 | 4/1986 | European Pat. Off. . |
| 481 313 A1 | 4/1992 | European Pat. Off. . |
| 58-199578 | 11/1983 | Japan . |
| 61-263176 | 11/1986 | Japan . |
| 5-283753 | 10/1993 | Japan . |
| 7-162039 | 6/1995 | Japan . |
| 8-18109 | 1/1996 | Japan . |
| 1130334 | 10/1968 | United Kingdom . |
| 2 160 358 | 12/1985 | United Kingdom . |

*Primary Examiner*—Fetsum Abraham
*Attorney, Agent, or Firm*—Parkhurst & Wendel, L.L.P.

[57] ABSTRACT

A thermoelectric conversion module having a large capacity and a curved surface which can be secured to a corresponding curved surface of a base member is manufactured by inserting N type and P type semiconductor strips into through holes formed in a honeycomb structural body, filling spaces between walls defining the through holes and the semiconductor strips with an electrically insulating filler members made of an easily deformable material such as polyimide resin and silicone resin, cutting the honeycomb structural body into a plurality of thermoelectric conversion module main bodies each having a desired surface configuration, and providing metal electrodes on both surfaces of a thermoelectric conversion module main body such that alternate N type and P type semiconductor elements are connected in cascade.

6 Claims, 4 Drawing Sheets

THERMOELECTRIC CONVERSION MODULE HAVING CHANNELS FILLED WITH SEMICONDUCTING MATERIAL AND INSULATING FILLERS

BACKGROUND OF THE INVENTION

1. Field of the Invention

The present invention relates to a thermoelectric conversion module for use in an apparatus utilizing a thermoelectric effect such as electronic cooling apparatus and electric power generating apparatus, and more particularly to a thermoelectric conversion module having N type semiconductor elements and P type semiconductor element connected in cascade by means of metal electrodes. The present invention also relates to a method of manufacturing such a thermoelectric conversion module.

2. Related Art Statement

There have been proposed various kinds of thermoelectric conversion modules utilizing the Seebeck effect, Peltier effect and Thomson effect. Among these thermoelectric conversion modules, there have been realized a Seebeck effect element and Peltier effect element, in which a thermoelectric element is formed by joining different kinds of metals. In the Seebeck effect element, different kinds of metals are joined to constitute a closed loop, and thermoelectricity is generated by making junctions at a different temperatures. Such a Seebeck effect element may be utilized as thermoelectricity element. In the Peltier effect element, different kinds of metals are joined to form a closed loop and an electric current is passed through the loop in a given direction to effect heat absorption at one junction point and heat generation at the other junction point. Such a thermoelectric element may be utilized as a thermoelectric heating element or thermoelectric cooling element. In order to improve the efficiency of these elements, a junction between a semiconductor and a metal has been widely used, because a larger Seebeck coefficient and Peltier coefficient can be obtained by a semiconductor-metal junction than a metal-metal junction.

FIG. 1 is a schematic view showing a principal structure of a known thermoelectric conversion module constructed as the above mentioned thermoelectricity element. The thermoelectric conversion module comprises a number of N type semiconductor elements 1 and a number of P type semiconductor elements 2, said N and P type semiconductor elements being arranged alternately. Adjacent N type and P type semiconductor elements 1 and 2 are connected in cascade by means of electrodes 3 made by metal segments. The left side N type semiconductor element 1 and the right side P type semiconductor element 2 of the cascade connection semiconductor element array are connected to opposite ends of a load 4. One side of the semiconductor array is placed in a higher temperature environment and the other side is placed in a lower temperature environment. Then, in each of the N type semiconductor elements 1, electrons flow from the high temperature side to the low temperature side as shown by solid lines (an electric current flows from the low temperature side to the high temperature side). In each of the P type semiconductor elements 2, holes flow from the high temperature side to the low temperature side as depicted by broken lines (an electric current flows from the high temperature side to the low temperature side). Therefore, a voltage is applied across the load 4 with a polarity as depicted in FIG. 1. The semiconductor elements 1 and 2 may be made of Bi—Te semiconductor (for instance $Bi_2Te_3$), Bi—Sb semiconductor (for example $Bi_{0.88}Sb_{0.12}$) or Si—Ge (for instance $Si_{0.8}Ge_{0.2}$).

FIG. 2 is a perspective view showing a known method of manufacturing the above mentioned known thermoelectric conversion module. On a surface of an insulating substrate 5 are secured electrode metal segments 6 by brazing in accordance with a given pattern. Then, N type semiconductor elements 1 and P type semiconductor elements 2 are secured to the metal strips 6 by brazing or soldering. The semiconductor elements 1 and 2 may be formed by a single crystal melting method or a sintered semiconductor material cutting method. On upper surfaces of the N type and P type semiconductor elements 1 and 2 there are secured metal segments 7 by means of brazing or soldering. In this manner, the N type semiconductor elements 1 and P type semiconductor elements 2 are arranged alternately and are connected in cascade by means of the metal strips 6 and 7. In this case, it has been proposed to secure the metal segments 7 simultaneously to the semiconductor elements 1 and 2 by using an insulating plate on which a metal electrode pattern is previously formed.

In Japanese Patent Publications Nos. 58-199578 (JP 58-199578), 61-263176 (JP 61-263176), 5-283753 (JP 5-283753), 7-162039 (JP 7-162039) and 8-18109 (JP 8-18109), there are disclosed various known methods of manufacturing thermoelectric conversion modules. In JP 58-199578, after N type semiconductor elements and P type semiconductor elements are arranged alternately, spaces between adjacent semiconductor elements are filled with an adhesive agent. In JP 61-263176, there is described a method, in which an N type semiconductor layer and a P type semiconductor layer are successively deposited one on the other, spaces other than contact regions of these layers are filled with a glassy material. In a method disclosed in JP 5-283753, N type semiconductor elements and P type semiconductor elements are alternately arranged in multi-holes of a heat resisting isolator. Further, in JP 7-162039, there is described a method, in which a single array of through holes are formed in a mold body and N type semiconductor elements and P type semiconductor elements are alternately inserted in these through holes. Finally, in JP 8-18109, there is disclosed a thermoelectric module comprising N type and P type semiconductor elements and an insulating material such as synthetic resin, ceramics and glass filling spaces between adjacent semiconductor elements. Such a thermoelectric module is manufactured by forming an N type semiconductor layer on a glass substrate, forming a P type semiconductor layer on the other glass substrate, cutting the semiconductor layers by a dicing machine, respectively to obtain members in which pillar-like N type and P type semiconductor elements are aligned, assembling these members such that the N type semiconductor elements and P type semiconductor elements are arranged alternately, and filling spaces between these semiconductor elements with an insulating material.

When a large capacity thermoelectric conversion module including a large number of thermoelectric elements is to be manufactured by the known method shown in FIGS. 2, extremely high working precision and high assembling faculty are required, and thus a manufacturing cost will be increased very much. Moreover, it is impossible to manufacture a thermoelectric conversion module having a curved surface. Such a curved surface is required when a thermoelectric conversion module is secured to a base member having a curved surface. In this manner, the module made by this known method could not be used in various applications. For instance, when the thermoelectric conversion module is applied to a system in which an electric power is generated by using a wasted heat of an internal combustion engine, a space for providing the thermoelectric conversion module is limited and in many cases it is desired to provide the thermoelectric conversion module on a curved surface. However, the module made by the above mentioned known method could not have a curved surface, and therefore could not be applied to such a thermoelectric power system.

In the known method described in JP 58-199578, the arrangement of the N type and P type semiconductor elements requires very complicated work, high working precision and high assembling faculty, and thus a manufacturing cost becomes very high. In the known method described in JP 61-263176, due to a difference in a thermal expansion coefficient between the semiconductor material and the glassy material, the thermoelectric conversion module is subjected to damage through a heat cycle and has a short life time. In the known methods disclosed in JP 5-283753 and 7-162039, the insertion of the N type and P type semiconductor elements into the holes of the insulating substrate requires high working precision and faculty, so that the manufacturing cost becomes very high. Furthermore, the thermoelectric conversion module might be damaged through a heat cycle due to a difference in thermal expansion coefficient. In the known method proposed in JP 8-18109, the array of semiconductor elements is formed by the dicing machine, it is very difficult to manufacture a thermoelectric conversion module having a small size. Therefore, a capacity of the thermoelectric conversion module is limited. Further, due to a difference in thermal expansion coefficient between the semiconductor elements and the insulating material filling the spaces between these semiconductor elements, the thermoelectric conversion module might be damaged and its durability is also limited.

SUMMARY OF THE INVENTION

The present invention has for its object to provide a useful and novel thermoelectric conversion module having a curved surface and a large capacity.

It is another object of the invention to provide a method of manufacturing a thermoelectric conversion module having a large capacity and a curved surface in an accurate, simple and less expensive manner.

According to the invention, a thermoelectric conversion module comprises:
  a honeycomb structural body made of an electrically insulating material and having a first surface, a second surface opposing to said first surface, and a plurality of channels which extend from said first surface to said second surface, alternate one or more channels of said plurality of channels being classified into a first group and the remaining channels being classified into a second group;
  a plurality of electrically insulating filler members, each of which is provided in respective one of said channels of the honeycomb structural body and has formed therein a through hole extending from the first surface to the second surface of said honeycomb structural body;
  a plurality of N type semiconductor elements, each of which is provided in respective one of the through holes of said electrically insulating filler members formed in said channels belonging to the first group;
  a plurality of P type semiconductor elements, each of which is provided in respective one of the through holes of the electrically insulating filler members formed in said channels belonging to the second group; and metal electrodes provided on said first and second surfaces of the honeycomb structural body such that adjacent one or more N type semiconductor elements and one or more P type semiconductor elements provided in the channels belonging alternately to the first and second groups are connected in cascade by means of said metal electrodes.

According to the invention, a method of manufacturing a thermoelectric conversion module comprises the steps of:
  preparing a honeycomb structural body made of an electrically insulating material and having a first surface, a second surface opposing to said first surface, and a plurality of channels which extend from said first surface to said second surface, alternate one or more of said channels being classified into a first group and the remaining channel being classified into a second group;
  inserting N type and P type semiconductor strips into the channels belonging to the first and second groups, respectively;
  filling spaces formed between walls defining the channels and the semiconductor elements inserted therein with electrically insulating filler members;
  cutting said honeycomb structural body into a plurality of thermoelectric conversion module main bodies of a desired shape, each of which has N type and P type semiconductor elements provided within said channels and exposed at mutually opposing first and second surfaces; and
  forming metal electrodes on opposite surfaces of said thermoelectric conversion module main body such that adjacent one or more N type semiconductor elements and one or more P type semiconductor elements are connected in cascade by means of said metal electrodes.

In a preferable embodiment of the method of manufacturing the thermoelectric conversion module according to the invention, said electrodes for connecting the exposed end surfaces of the N type and P type semiconductor elements are formed by a printing, brazing or soldering.

In the thermoelectric conversion module according to the invention, the N type and P type semiconductor elements are provided into the through holes formed in the electrically insulating filler members provided in the channels of the honeycomb structural body, and thus the semiconductor elements can be accurately and stably fixed in position within the channel by means of the electrically insulating filler members. Therefore, the number of elements to be dropped out of the honeycomb or to be arranged imperfectly becomes very small, so that the thermoelectric conversion module having a large capacity can be obtained easily. Moreover, a surface configuration of the thermoelectric conversion module can be formed in any desired shape, and thus it is possible to realize the thermoelectric conversion module having a curved surface which can be brought into direct contact with a curved surface of a base member. Further, when the electrically insulating filler member is made of an easily deformable material, a difference in thermal expansion coefficient between the honeycomb structural body and the semiconductor material can be absorbed by the electrically insulating filler member. Therefore, even if the thermoelectric conversion module is subjected to a sever heat cycle, it can be effectively prevented from being damaged and its life time is prolonged.

In the method according to the invention, after inserting the semiconductor strips into the channels of the honeycomb structural body and positioning these semiconductor strips by means of the electrically insulating filler members, the honeycomb structural body is cut into a plurality of honeycomb structural main bodies. Therefore, a required precision for the honeycomb structural body and semiconductor strips is reduced, and a yield of the honeycomb conversion module main body is improved. In this manner, it is possible to manufacture the thermoelectric conversion module having large capacity and curved surface in an accurate, easy and less expensive manner.

DESCRIPTION OF THE PREFERRED EMBODIMENTS

Figure 1:
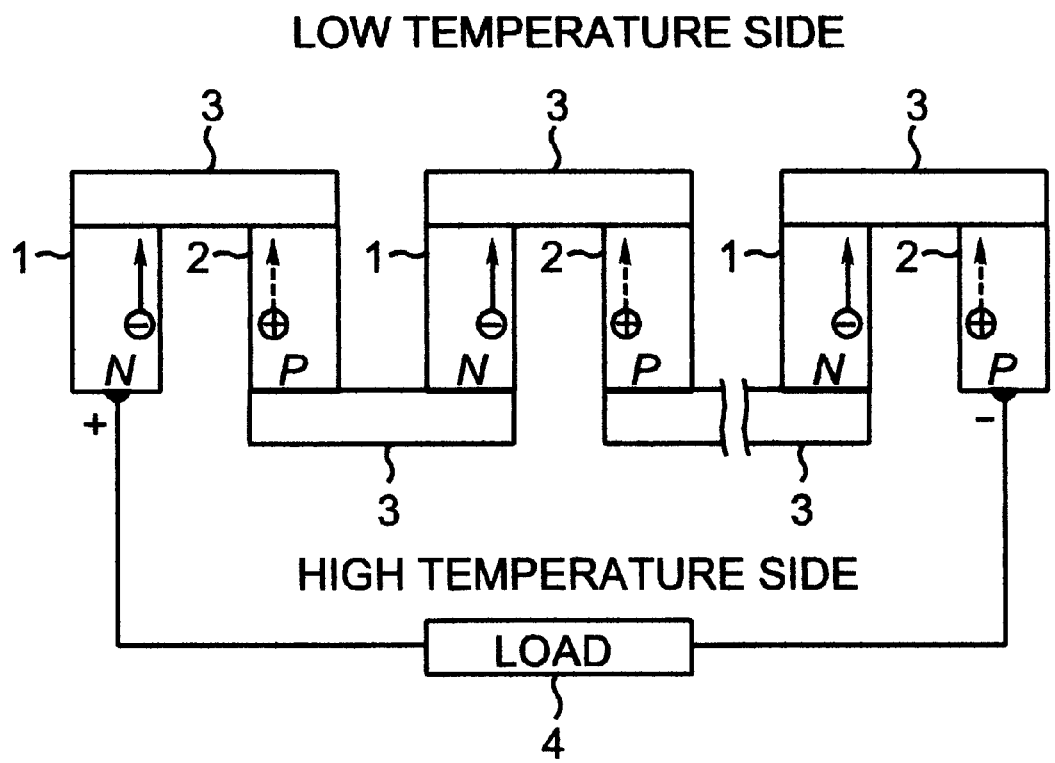
FIG. 1 is a schematic view showing a known thermoelectric conversion module.
Figure 2:
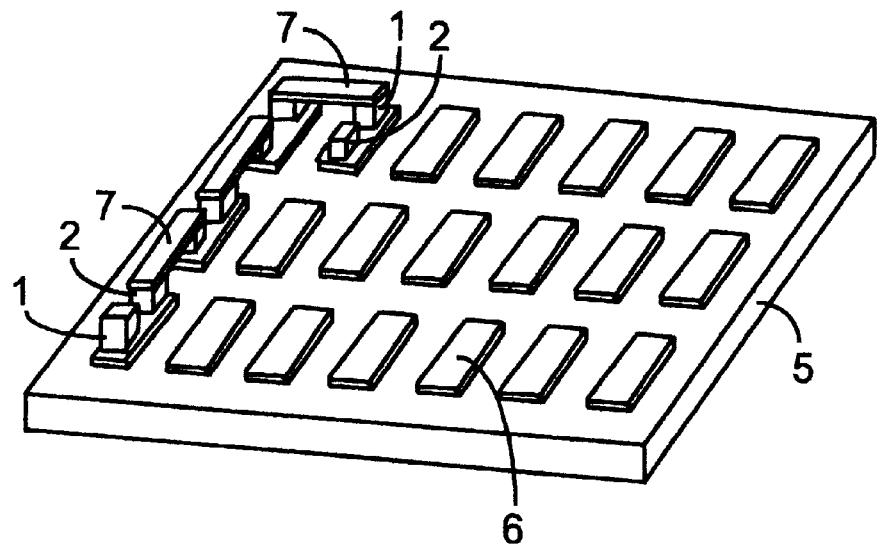
FIG. 2 is a perspective view illustrating a known method of manufacturing the thermoelectric conversion module.
Figure 3:
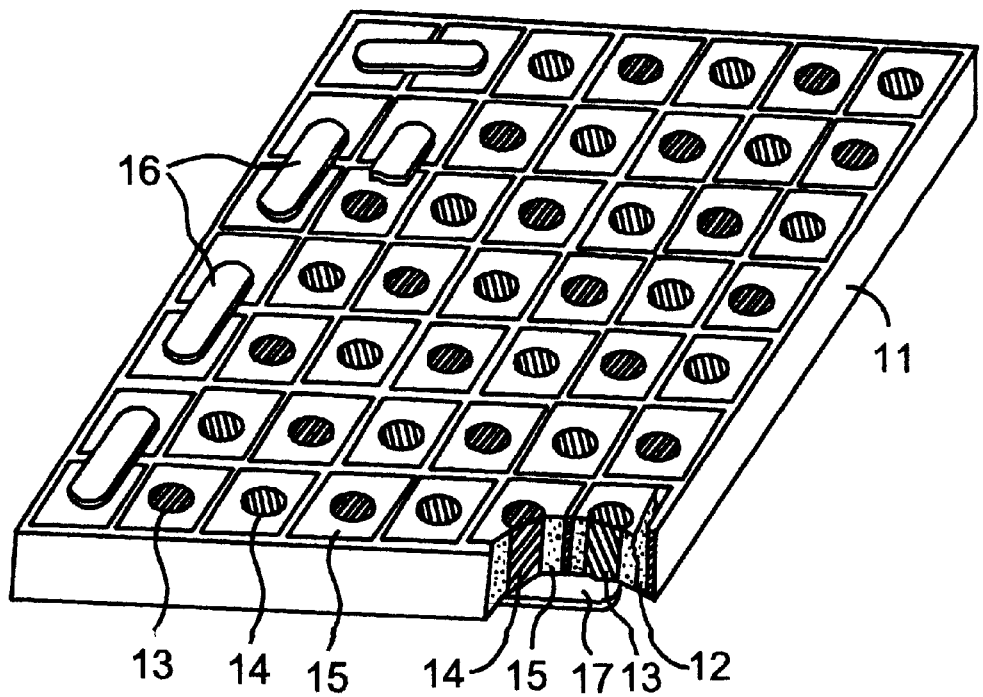
FIG. 3 is a perspective view depicting an embodiment of the thermoelectric conversion module according to the invention.

FIG. 3 is a perspective view showing an embodiment of the thermoelectric conversion module according to the invention by partially cutting away. The thermoelectric conversion module of the present embodiment comprises a honeycomb structural body 11 made of an electrically insulating material and having a number of thin channels in the shape of through holes 12 in which N type semiconductor elements 13 and P type semiconductor elements 14 are provided. According to the invention, spaces between walls defining the channels 12 and the semiconductor elements 13 and 14 are filled with electrically insulating filler members 15 such that the semiconductor elements are placed in position within respective channels. In the present embodiment, N type semiconductor elements 13 and P type semiconductor elements 14 are arranged alternately. Upper and lower end surfaces of the N type and P type semiconductor elements 13 and 14 are connected by means of upper electrodes 16 and lower electrodes 17 such that the N type and P type semiconductor elements are connected in a cascade manner.

FIGS. 4A–4E show successive steps of an embodiment of the method of manufacturing the thermoelectric conversion module according to the invention shown in FIG. 3.

Figure 4A:
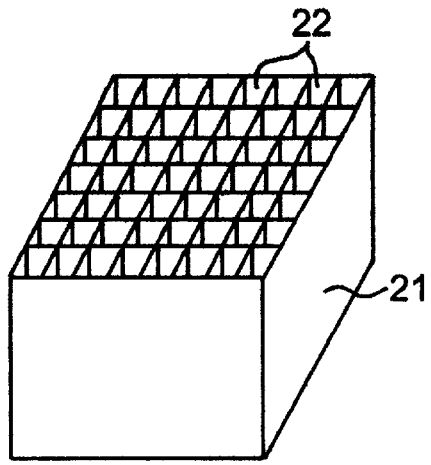
FIGS. 4A–4E are views showing successive steps of an embodiment of the method according to the invention.

At first, as illustrated in FIG. 4A, an electrically insulating honeycomb structural body 21 having a large number of channels 22 formed therein is prepared. In the present embodiment, the channels 22 are formed in the shape of square through holes each having a cross sectional area of 25 mm$^2$ (one side is 5 mm). This honeycomb structural body 21 is made of cordierite ($Mg_2Al(AlSi_5)O_{18}$) and has a height of 10 cm. In the present embodiment, a lateral cross section of a through hole 22 has a square shape, but according to the invention, the through hole may have any arbitrary cross sectional shape such as circular, triangular, rectangular and hexagonal. In FIG. 4A, the through hole 22 is drawn to have a large dimension in comparison with the honeycomb structural body 21 for the sake of clarity, so that the number of through holes are shown to be small, but in an actual module, a very large number of through holes 22 each having a very small cross section are formed.

Figure 4B:
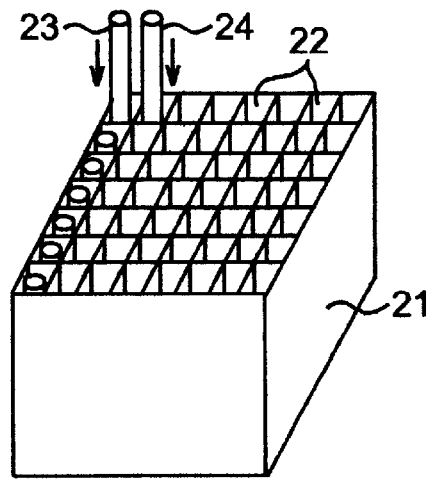

Next, as illustrated in FIG. 4B, N type semiconductor strips 23 and P type semiconductor strips 24 are inserted into alternate through holes 22. In the present embodiment, the N type semiconductor strip 23 is made of $Si_{0.8}Ge_{0.2}$ containing phosphorus (P) by 0.2 weight % as N type dopant, and P type semiconductor strip 24 is made of $Si_{0.8}Ge_{0.2}$ containing boron (B) by 0.05 weight % as P type dopant. In the present embodiment, the semiconductor strips 23 and 24 have a circular cross section having a diameter of 4 mm and a length of not less than 10 cm. According to the invention, the semiconductor strips may have any desired cross sectional shape such as square, triangular, and rectangular shapes. It should be noted that the N type and P type semiconductor strips 23 and 24 may be inserted into successive through holes 22 alternately or the N type semiconductor strips may be inserted into every other through holes one by one or simultaneously and then the P type semiconductor strips may be inserted into the remaining through holes one by one or simultaneously.

Figure 4C:
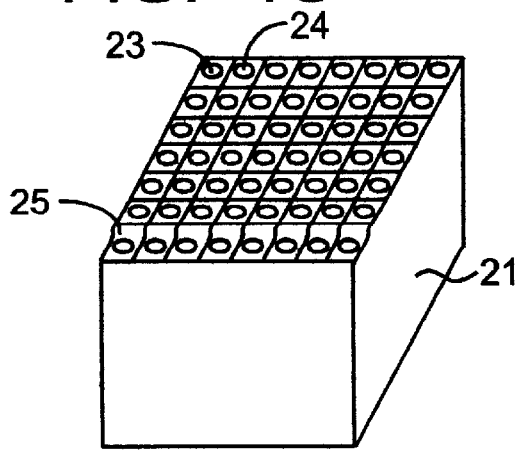

Next, as illustrated in FIG. 4C, spaces between the walls defining the through holes 22 and the semiconductor strips 23, 24 are filled with an electrically insulating filler members 25. This may be conducted by immersing the honeycomb structural body 21 having the semiconductor strips 23, 24 inserted therein into a melt of an electrically insulating filler material. Alternatively, a lower end of the honeycomb structural body 21 may be inserted into a melt of the electrically insulating filler material to suck the molten material into the spaces between the walls and the semiconductor strips 23, 24 by an action of the capillary phenomenon.

Figure 4D:
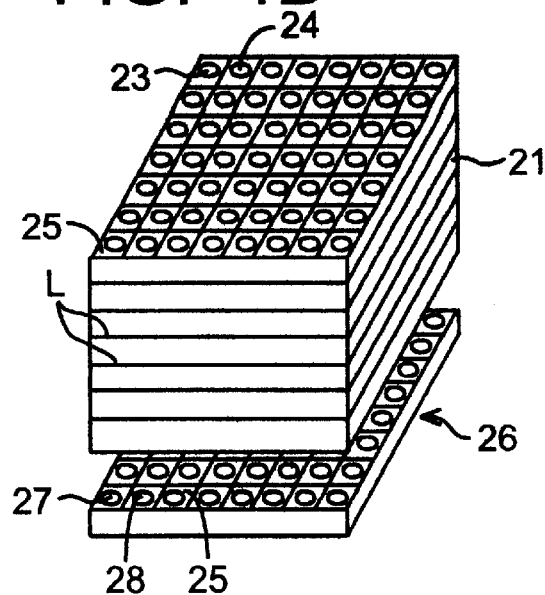
Figure 4E:
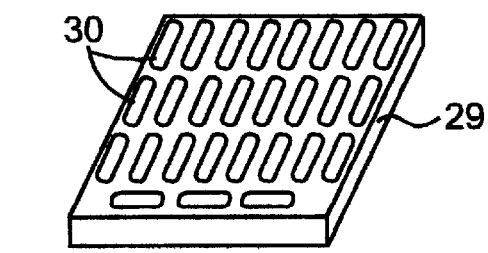
Figure 4E:
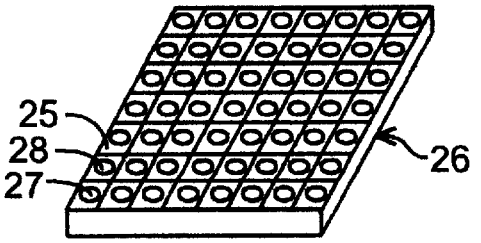

Then, after drying the electrically insulating melt to form the electrically insulating filler members 25 within the through holes 22, the honeycomb structural body 21 is cut along a plane L which is perpendicular to the through holes 22 as shown in FIG. 4D into a plurality of thermoelectric conversion module main bodies 26 each having a thickness of, for instance 5 mm. By this cutting process, the N type and P type semiconductor strips 23 and 24 are also cut to constitute N type and P type semiconductor elements 27 and 28 in each of the thermoelectric conversion module main body. Next, as shown in FIG. 4E, on upper and lower surfaces of a thermoelectric conversion module main body 26 are provided insulating plates 29 and 31, respectively each having electrodes 30 and 32 formed thereon in accordance with given patterns by screen printing. It should be noted in FIG. 4E, the upper insulating plate 29 is shown in an up side down fashion so that the electrodes 30 are seen. In this manner, the N type semiconductor elements 27 and P type semiconductor elements 28 are alternately connected in cascade by means of the electrodes 30 and 32 to complete the thermoelectric conversion module shown in FIG. 3.

As explained above, in the method according to the invention, the semiconductor elements 27 and 28 are supported by the electrically insulating filler members 25 within the through holes 22 of the honeycomb structural body 21. Now the electrically insulating filer members 25 will be further explained in detail. The electrically insulating filler member 25 has function to fix the semiconductor strip 23 or 24 in position within a through hole of the honeycomb structural body 21. According to the invention, it is preferable to make the filler member 25 of an easily deformable material. Then, a contact surface area between a wall surface defining the through hole and a semiconductor strip becomes large, and thus it is possible to hold the semiconductor strip stably within the through hole. Moreover, the filler member 25 serves as a buffer member for absorbing the deformation of the honeycomb structure and semiconductor element due to a thermal expansion. Therefore, even if the thermoelectric conversion module is subjected to a heat cycle, it can be effectively prevented from being damaged. In this manner, a life time of the thermoelectric conversion module can be prolonged. In order to improve the above mentioned function of the filler member, it is preferable that the filler member has an intermediate thermal expansion coefficient between a thermal expansion coefficient of the honeycomb structural body and a thermal expansion coefficient of the semiconductor material.

Furthermore, in view of the manufacturing process, by using the filler members 25, the semiconductor strips 23 and 24 can be easily inserted into the through holes 22 of the honeycomb structural body 21, and thus the honeycomb structural body and semiconductor strips can be assembled easily without requiring a high precision. Moreover, these constructional parts can have relatively large tolerance. In this manner, a yield of manufacturing the thermoelectric conversion module is improved and quality of the thermoelectric conversion module is increased.

The electrically insulating filler members 25 may be made of an easily deformable material such as silicone resin and polyimide resin. As the silicone resin, use may be made of a silicone condensation product, in which almost all active hydrogens serving to cut siloxane bonds are sealed with an acetone type curing agent. A room temperature vulcanization silicone resin manufactured and sold by Shin-Etsu Chemical Co., Ltd. under a trade name of "KE3418" may be advantageously used. Such a silicone resin has superior heat resistance and electrically insulating characteristics and can be particularly advantageously used as the filler member material in the thermoelectric conversion module according to the invention.

As explained above, the electrodes 30 and 32 are joined to the exposed end surfaces of the semiconductor elements 27 and 28. These electrodes 30 and 32 may be made of an electrically conductive material such as Al, Cu, Fe (stainless) and $La_{0.8}Ca_{0.2}CoO_3$. It is preferable to join the electrodes to the semiconductor elements by means of a metal brazing material which has a good chemical affinity and a thermal expansion coefficient which is intermediate between a thermal expansion coefficient of the electrode and a thermal expansion coefficient of the semiconductor material. The semiconductor elements may be made of semiconductor such as Si—Ge, Pb—Te and Bi—Te.

Figure 5A:
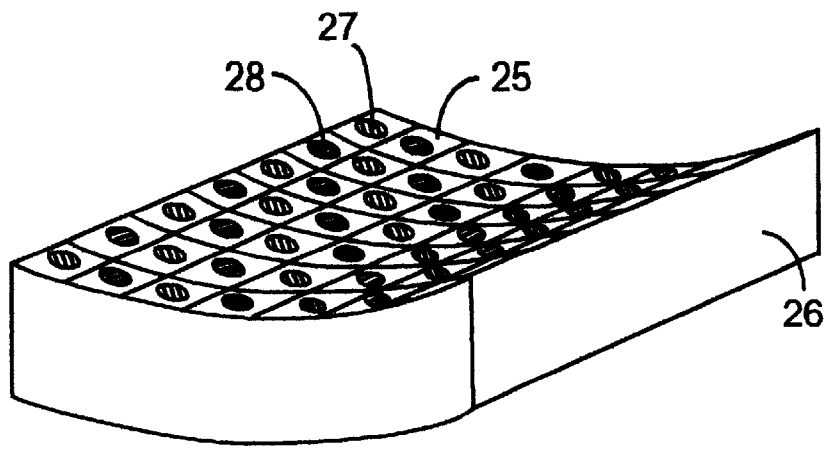
FIGS. 5A–5C are perspective and cross sectional views depicting another embodiment of the thermoelectric conversion module according to the invention.
Figure 5B:
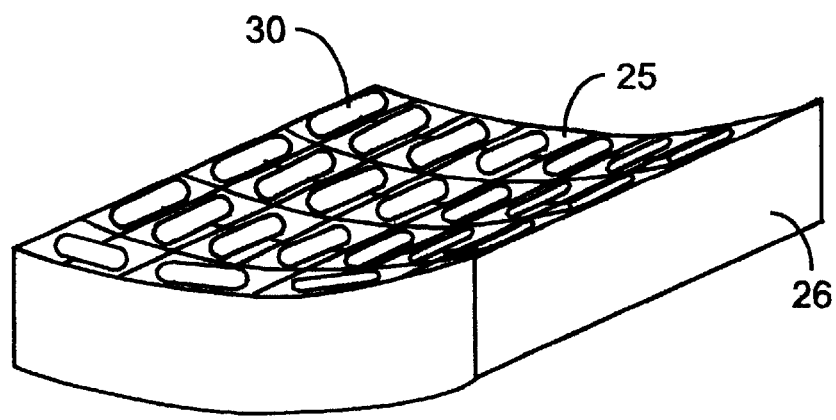
Figure 5C:
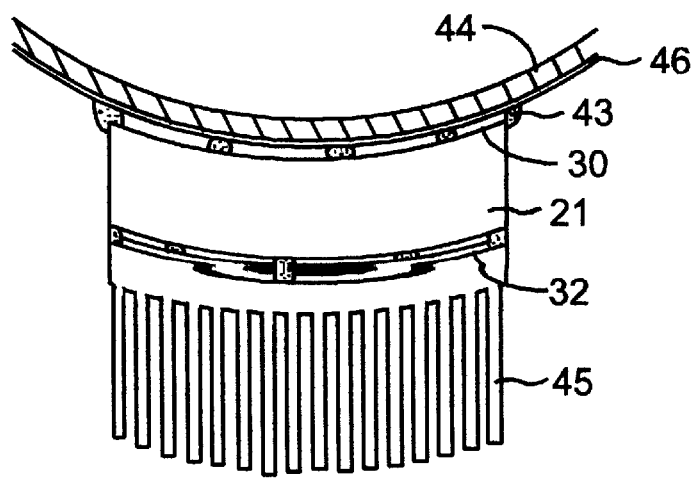

FIGS. 5A–5C show another embodiment of the thermoelectric conversion module according to the invention. In the present embodiment, the honeycomb structural main body 26 including a number of N type and P type semiconductor elements 27 and 28 embedded in the electrically insulating filler members 25 is formed by cutting the honeycomb structural body 21 formed by the steps shown in FIGS. 4A–4C such that the honeycomb structural main body 26 has curved upper and lower surfaces as depicted in FIG. 5A. Then, the electrodes are provided by any one of known methods on the curved surfaces to connect the N type and P type semiconductor elements 27 and 28 in cascade as shown in FIG. 5B, in which only the electrodes 30 provided on the upper curved surface are shown. As depicted in FIG. 5C, the upper surface of the thermoelectric conversion module is secured to a curved surface of an exhaust pipe 44 by means of a commercially available ceramics adhesive agent 43. On the other curved surface of the thermoelectric conversion module, there is secured a cooling fin 45 by the same adhesive agent. It should be noted that the surface of the exhaust pipe 44 has an electrically insulating coating or layer 46. An electrically insulating coatings may be formed on the upper and lower surfaces of the thermoelectric conversion module according to the invention by a known thick film forming process or painting. In this manner, according to the invention, the upper and lower surfaces of the thermoelectric conversion module can be formed into any desired shape so that the thermoelectric conversion module can be directly secured to heat generating members having various surface configurations.

The present invention is not limited to the embodiments so far explained, but many alternations and modifications can be conceived by those skilled in the art within the scope of the invention. For instance, only one surface of the thermoelectric conversion module may be curved.

As explained above in detail, according to the invention, it is possible to provide the thermoelectric conversion module having a large capacity and any desired surface configuration. Moreover, when the electrically insulating filler member is made of an easily deformable material, the thermoelectric conversion module can be prevented from being damaged by the heat cycle due to a difference in thermal expansion coefficient between the honeycomb structural body and the semiconductor elements.

Furthermore, in the method of manufacturing the thermoelectric conversion module according to the invention, after inserting the semiconductor strips into the through holes formed in the honeycomb structural body and filling the spaces between the semiconductor strips and the walls defining the through holes with the electrically insulating filler members to hold the semiconductor strips in position within the through holes, the honeycomb structural body is cut into the thermoelectric conversion module main bodies. In this manner, it is possible to form easily the thermoelectric conversion module having a large capacity and a desired surface configuration at a less expensive manner.

What is claimed is:

1. A thermoelectric conversion module comprising:
    a honeycomb structural body made of an electrically insulating material and having a first surface, a second surface opposing to said first surface, and a plurality of channels which extend from said first surface to said second surface, alternate one or more channels of said plurality of channels being classified into a first group and the remaining channels being classified into a second group;
    a plurality of electrically insulating filler members, each of which is provided in respective one of said channels of the honeycomb structural body and has formed therein a through hole extending from the first surface to the second surface of said honeycomb structural body;
    a plurality of N type semiconductor elements, each of which is provided in respective one of the through holes of said electrically insulating filler members formed in said channels belonging to the first group;
    a plurality of P type semiconductor elements, each of which is provided in respective one of the through holes of the electrically insulating filler members formed in said channels belonging to the second group; and
    metal electrodes provided on said first and second surfaces of the honeycomb structural body such that adjacent one or more N type semiconductor elements and one or more P type semiconductor elements provided in the channels belonging alternately to the first and second groups are connected in cascade by means of said metal electrodes.

2. A thermoelectric conversion module according to claim 1, wherein a first set of regions each of which includes a plurality of N type semiconductor elements inserted in through holes formed in electrically insulating filler members provided in a plurality of adjacent channels and a second set of regions each of which includes a plurality of P type semiconductor elements inserted in through holes formed in electrically insulating filler members provided in a plurality of adjacent channels are arranged alternately, and N type and P type semiconductor elements of successive first and second sets of regions are connected by the metal electrodes at the first and second surfaces of the honeycomb structural body in cascade.

3. A thermoelectric conversion module according to claim 1, wherein at least one of said first and second surfaces of the honeycomb structural body is curved.

4. A thermoelectric conversion module according to claim 1, wherein said honeycomb structural body is made of a cordierite.

5. A thermoelectric conversion module according to claim 1, wherein said electrically insulating filler member is made of an easily deformable material.

6. A thermoelectric conversion module according to claim 5, wherein said easily deformable material is made of polyimide resin or silicone resin.

* * * * *